(12) United States Patent
Avery et al.

(10) Patent No.: US 6,292,764 B1
(45) Date of Patent: Sep. 18, 2001

(54) TUNABLE ARCHITECTURE FOR DEVICE ADAPTER

(75) Inventors: James M. Avery; William D. Isenberg, both of Fort Collins, CO (US)

(73) Assignees: Hyundai Electronics America, Inc., San Jose, CA (US); NCR Corporation, Dayoton, OH (US)

( * ) Notice: Subject to any disclaimer, the term of this patent is extended or adjusted under 35 U.S.C. 154(b) by 0 days.

(21) Appl. No.: 08/497,003

(22) Filed: Jun. 30, 1995

Related U.S. Application Data

(63) Continuation of application No. 08/254,022, filed on Jun. 3, 1994, now abandoned.

(51) Int. Cl.[7] .................................................. G06F 9/455
(52) U.S. Cl. ............................................................ 703/14
(58) Field of Search ............................. 709/234; 703/13, 703/14, 15, 16, 21

(56) References Cited

U.S. PATENT DOCUMENTS

| | | | |
|---|---|---|---|
| 4,075,691 | * 2/1978 | Davis et al. | 710/64 |
| 4,313,160 | 1/1982 | Kaufman et al. | 710/23 |
| 4,424,565 | 1/1984 | Larson | 709/245 |
| 4,751,634 | * 6/1988 | Burrus, Jr. et al. | 710/63 |
| 4,761,735 | 8/1988 | Amy | 710/26 |
| 4,807,121 | 2/1989 | Halford | 710/53 |
| 4,825,357 | 4/1989 | Ovies et al. | 710/29 |
| 4,839,890 | 6/1989 | Semerau et al. | 370/503 |
| 4,922,432 | 5/1990 | Kobayashi et al. | 716/17 |
| 4,935,868 | 6/1990 | DuLac | 710/126 |
| 4,967,367 | * 10/1990 | Piednoir | 716/2 |
| 5,123,092 | 6/1992 | Buxton et al. | 710/107 |
| 5,191,653 | * 3/1993 | Banks et al. | 710/113 |
| 5,197,015 | * 3/1993 | Hartoog et al. | 716/12 |
| 5,197,016 | * 3/1993 | Sugimoto et al. | 716/8 |
| 5,222,062 | 6/1993 | Sharma et al. | 370/218 |
| 5,299,315 | * 3/1994 | Chin et al. | 710/110 |
| 5,303,161 | * 4/1994 | Burns et al. | 716/9 |
| 5,329,634 | * 7/1994 | Thompson | 710/8 |
| 5,394,556 | 2/1995 | Oprescu | 709/220 |
| 5,577,213 | * 11/1996 | Avery et al. | 710/100 |
| 5,630,132 | * 5/1997 | Allran et al. | 709/100 |
| 5,796,622 | * 8/1998 | Noseyama | 716/2 |
| 5,963,454 | * 10/1999 | Dockser et al. | 716/18 |

FOREIGN PATENT DOCUMENTS

| | | |
|---|---|---|
| 0403117 | 12/1990 | (EP) . |
| 9102312 | 2/1991 | (EP) . |
| 0463301A2 | 1/1992 | (EP) . |
| 0562151 | 3/1992 | (EP) . |
| 533583A | 3/1993 | (EP) . |

OTHER PUBLICATIONS

An Expert Microprocessor–Based–Systems–Designer. An Overview and Status Report; NJ Dimopoulos et al.; May 9–10, 1991; pp. 338–391.

Data Transfer Interface Design in Dame; B. Hufer et al.; 5/19/93; p. 510–513.

* cited by examiner

*Primary Examiner*—Kenneth R. Coulter
(74) *Attorney, Agent, or Firm*—Townsend and Townsend and Crew LLP

(57) ABSTRACT

A method and apparatus for producing an electronic circuit which allows a device to be connected to a bus, such as a system bus in a computer. The invention accepts user specified parameters for configuring a device adapter which interfaces the device to the bus, and thereafter generates a customized device adapter based on such user specified parameters. By using a common design macro, which is programmable, a user can easily specify and generate custom device adapters for a plurality of dissimilar devices to be connected to the bus. A resulting adapter architecture allows for multiple, dissimilar devices to interface to a computer bus with a single device adapter integrated circuit or card.

25 Claims, 10 Drawing Sheets

Microfiche Appendix Included
(6 Microfiche, 404 Pages)

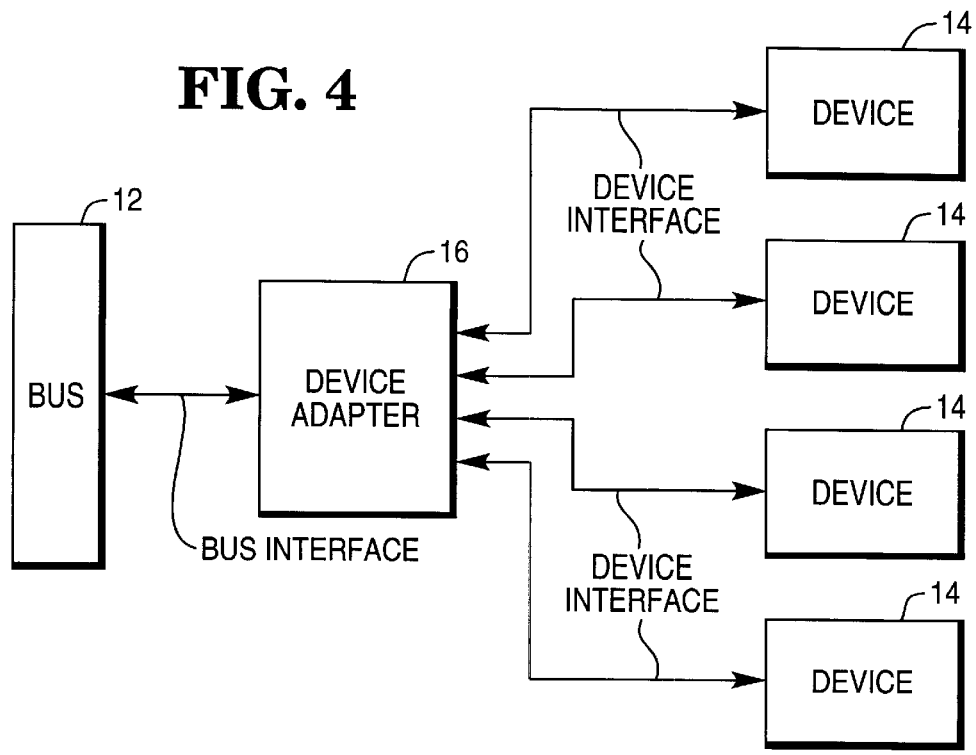
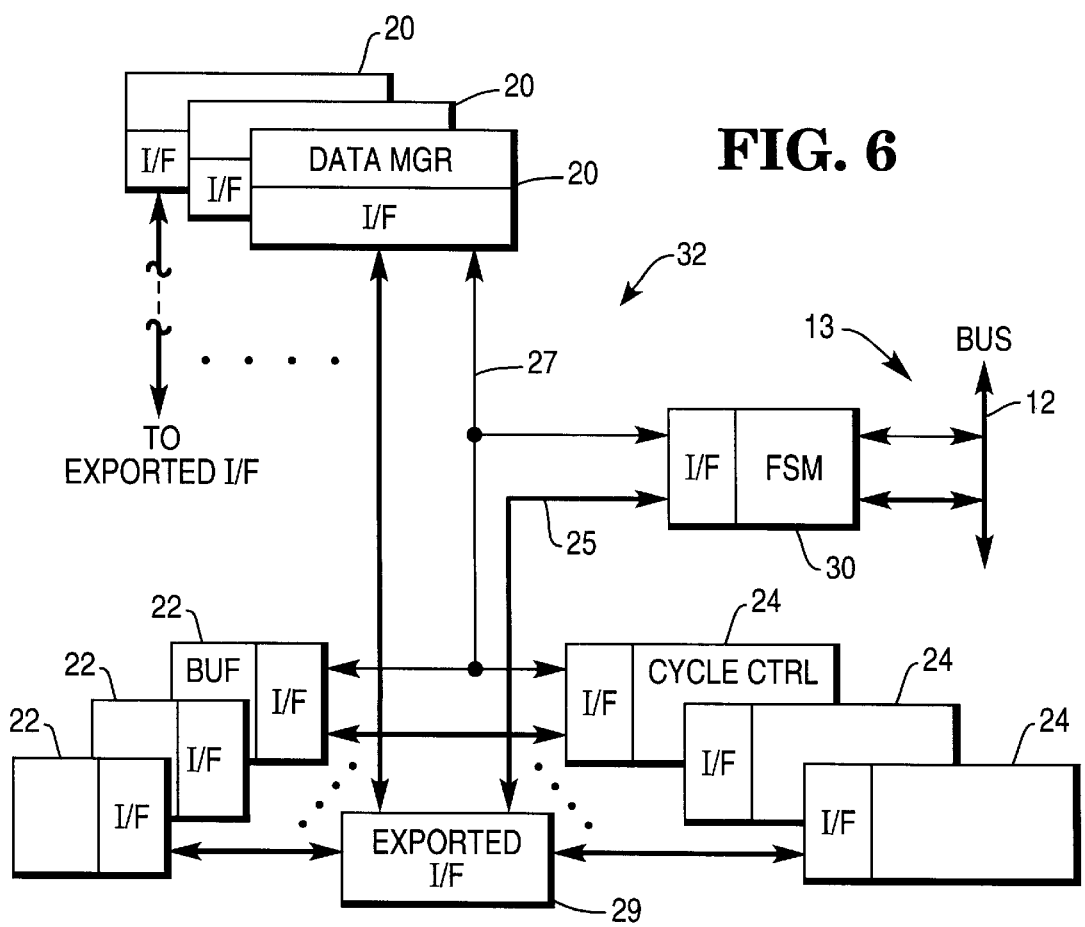

TUNABLE ARCHITECTURE FOR DEVICE ADAPTER

This is a continuation of application Ser. No. 08/254,022 filed Jun. 3, 1994 now abandoned.

CROSS REFERENCE TO RELATED APPLICATION

The present invention is related to commonly assigned and co-pending U.S. application entitled, "Multi-Device Adapter Card for Computer", invented by Avery and Isenberg, and having Ser. No. 08/253,530, now U.S. Pat. No. 5,577,213, filed concurrently herewith on Jun. 3, 1994, and hereby incorporated by reference.

A MICROFICHE APPENDIX is part of this patent. It includes six (6) fiche with four hundred and four (404) frames.

The invention concerns configurable device adapters for connecting dissimilar types of devices to a data processing system bus. The invention can optimally match the bus to each device, and for this reason the invention is called "tunable."

BACKGROUND OF THE INVENTION

This discussion will first explain a highly simplified data bus, and then illustrate how the simplified bus has evolved into a vast array of different types of data busses.

Different types of devices can generally be connected to a bus by different types of device adapters. However, device adapters do not necessarily result in optimal matching to a particular device, as will be explained.

FIG. 1 illustrates a highly simplified example of data transfer over a bus. The transfer sequence is the following, beginning at the top left part of the Figure:

1. The Sender places data onto the Data Lines, as indicated.
2. The Sender pulls a Ready line HIGH, as indicated, thereby telling the Receiver that the Data is ready.
3. In response, the Receiver collects the Data.
4. The Receiver pulls the Acknowledge line HIGH, thereby telling the Sender that the Receiver has taken the data, and that another piece of Data can be placed on the Data Lines.
5. The Sender detects the signal on the Acknowledge line, and pulls the Ready line LOW.
6. The Receiver responds by removing the signal on the Acknowledge line.

At this time, all lines are in their original conditions. The Sender may repeat the process by placing a second piece of Data onto the Data Lines.

The exemplary transaction given above is a highly simplified example. It easy to envision ways to improve and complicate the bus. Several examples are the following:

1. The Receiver may detect an error in the data, and may wish to request that a given piece of data be transmitted again. To accommodate this wish, an additional Repeat line can be provided, by which the Receiver requests the repeated transmission.

Thus, when the Sender receives a signal on the Repeat line, the Sender repeats the transmission. Conversely, if the Sender receives no such signal, but receives an acknowledge signal instead, the Sender sends the next piece of data.

2. Assume that the Sender places a piece of data on the Data Lines, and pulls the Ready line HIGH. How long should it wait for the acknowledge signal? What does the Sender do if it receives no acknowledgment signal within the allotted time?

One common approach to the problem is the following. If the Sender receives no acknowledgment signal within a specified time, then the Sender abandons the attempt to send data.

However, another approach is based on the supposition that, if the Receiver is busy performing another task when the Sender wants to send data, nevertheless, the Receiver is willing to accept the data when the task terminates. Under this approach, a Wait line can be provided. When the Sender sees a Wait signal, it does not abandon the attempt to send data, but waits for the Wait signal to disappear.

3. Suppose that other devices besides the Receiver are connected to the data bus. However, the Sender wishes to send data to a specific device, and wishes others to ignore the data. Selection lines can be added which instruct a specific device to listen to the data.

4. As in case 3, above, multiple devices are connected to the data bus. However, in contrast to the examples given above, now the devices wish to initiate communication: The devices now become Senders. Further, the devices simultaneously wish to send data. However, to allow them to do so would result in confusion.

A solution is to add Interrupt Lines. Each device asks permission, prior to sending data, by using the interrupt lines.

There are numerous additional examples of additional types of lines which can be added to a bus, to provide added features. Therefore, it is not surprising that numerous types of device interfaces exist, each with its own particular combination of lines and data transfer sequences.

Further, a device interface to a bus does not operate in isolation: if the device and bus attain the highest possible speed between themselves, it is possible that this speed was obtained at a cost to some other components or devices.

For example, assume that a bus couples together a processor and a printer. It is easy to see that very fast data transmission can occur if the processor devotes its full attention to the printer, and ignores all other devices on the bus, such as disc drives. However, under this scenario, the processor becomes unavailable for other tasks while tending the printer. Thus, while throughput of printed data is very high, other tasks have been brought to a standstill.

Viewed another way, in this example, the processor is capable of transmitting data at a far higher rate than the printer can print it. Thus, in fact, during the full-attention printing, the processor will be spending idle time while the printer prints. The processor could be performing other tasks during this idle time.

One solution to this type of problem is the use of buffering. A simple example will illustrate.

Assume that the Sender's data bus is 32 bits wide, as shown in FIG. 2. Assume that the Receiver's data bus is smaller, at 8 bits. A very crude device adapter could operate as STEP 1 through STEP 4 indicate. The Adapter transfers data in eight-bit chunks. However, a problem with this approach is immediately apparent. While the Receiver may be receiving data as fast it can, the Sender is tied to the bus during the Receiver's activity. The Sender can do nothing else. This approach is inefficient from the Sender's view.

As shown in FIG. 3, the Adapter can grab the entire 32-bit word from the Sender, and place the data in a Buffer. Now, the Buffer holds the data while the Adapter transmits it to the Receiver in eight-bit chunks. Now the Sender has been freed from waiting for the Receiver to receive the data.

For sending data in the opposite direction, wherein the Receiver sends data to the Sender, the Adapter would perform the opposite sequence. The Adapter would collect data from the Receiver in eight-bit chunks. When 32 bits have accumulated in the Buffer, the Adapter sends the 32 bits to the Sender.

While the buffering approach represents an improvement over the non-buffering approach, the buffering approach itself can be improved, by choosing the proper size of the buffers under the circumstances, as well as other parameters.

It should now be apparent that there are numerous design constraints which exist and trade-offs which are made when attaching a device to a bus. When designing an adapter to allow such attachment, hereinafter a device adapter, these design constraints and trade-offs result in a time consuming design effort for a particular type or class of device(s). When a subsequent type or class of device(s) is to attach to this bus, a similar intensive design effort is required to create a device adapter for this new device. There is a need for a system which allows for parameters, such as buffering specifications for a particular type or class of device, to be identified to a general purpose design macro, wherein a device adapter design is automatically generated which conforms to such user specified requirements. This device adapter design would thus be optimized for a given device which is to attach to a bus.

OBJECTS OF THE INVENTION

It is an object of the invention to provide an improved device adapter.

It is a further object of the invention to provide a device adapter which can be optimized, or tuned, to a given environment.

It is yet another object of the present invention to provide general purpose device adapter macro which can be customized, via user specified parameters, for a particular attaching device.

SUMMARY OF THE INVENTION

In one form of the invention, configurable device adapters are provided. The invention provides circuitry, for a particular type or class of device, which adapts the device to a bus. The individual circuitry for each device can be optimized, or "tuned," within certain parameter limits. A general purpose macro is used in conjunction with user specified parameters for a particular device, to generate a customized, or tuned, device adapter design based on such user specified parameters. Accordingly, a large degree of specific design information that would otherwise have to be manually provided by a user is automatically generated by use of the general purpose macro. The macro embodies a high degree of configuration to meet a wide variety of device support requirements. The user can thus configure the macro in such a way as to be tuned to meet particular system performance requirements.

The tunable architecture provides a basic architectural framework with contractual, or design-rules based, interfaces. By using contractual interfaces, the internals of a specific block can be configured without changing the interface design rules. With this concept, multiple behaviors and sub-block architectures can be implemented without changing the basic configurable macro concept.

BRIEF DESCRIPTION OF THE DRAWINGS

FIG. 4 is an overview of one form of the invention.

FIG. 6 shows internal interfaces having separated data and control.

DETAILED DESCRIPTION OF THE INVENTION

Overview

Figure 1:
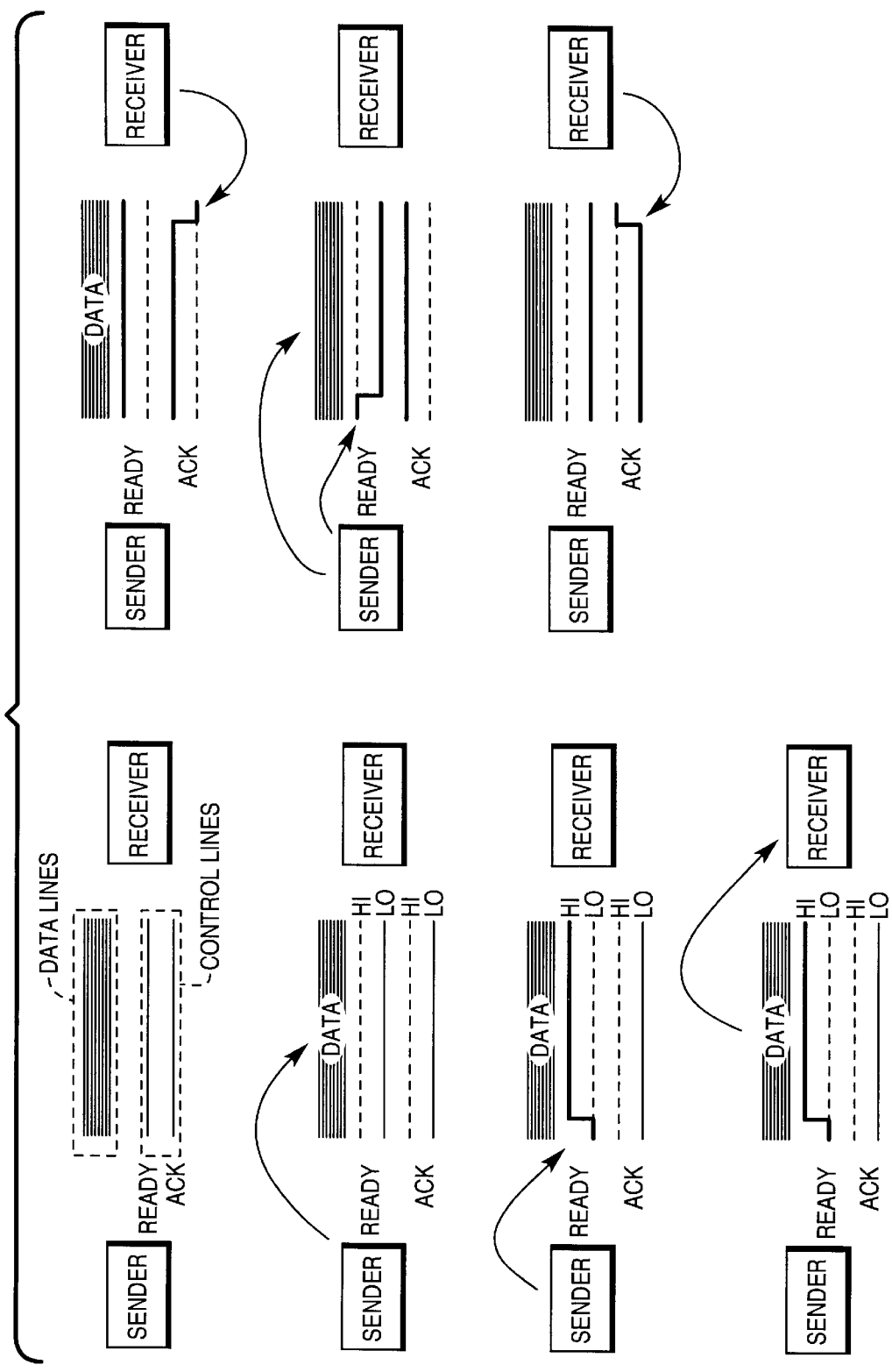
FIG. 1 illustrates a simplified bus for data transmission.
Figure 2:
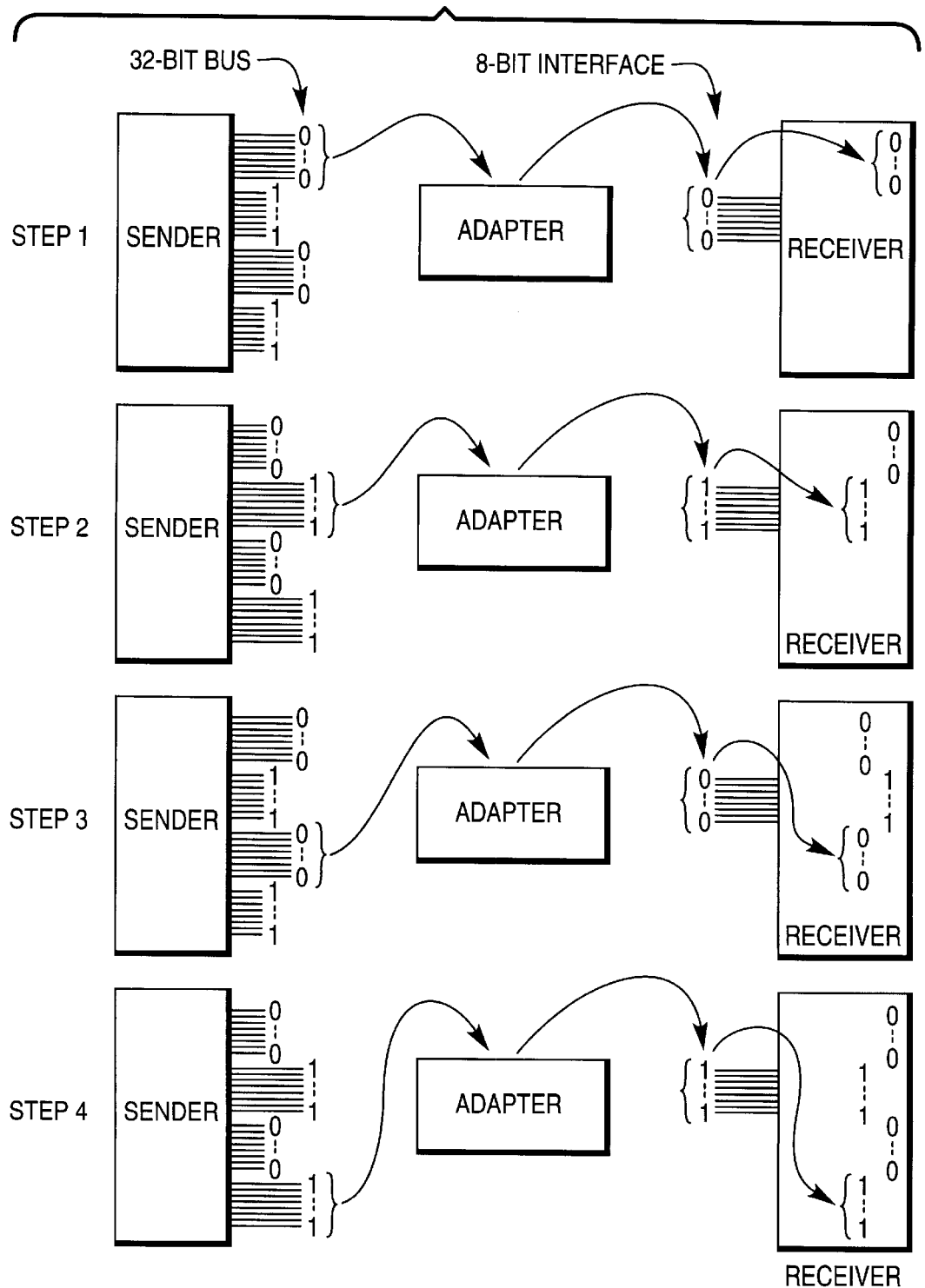
FIG. 2 illustrates a simple way of transferring data from 32-bit data bus to a receiver having an 8-bit data interface.
Figure 3:
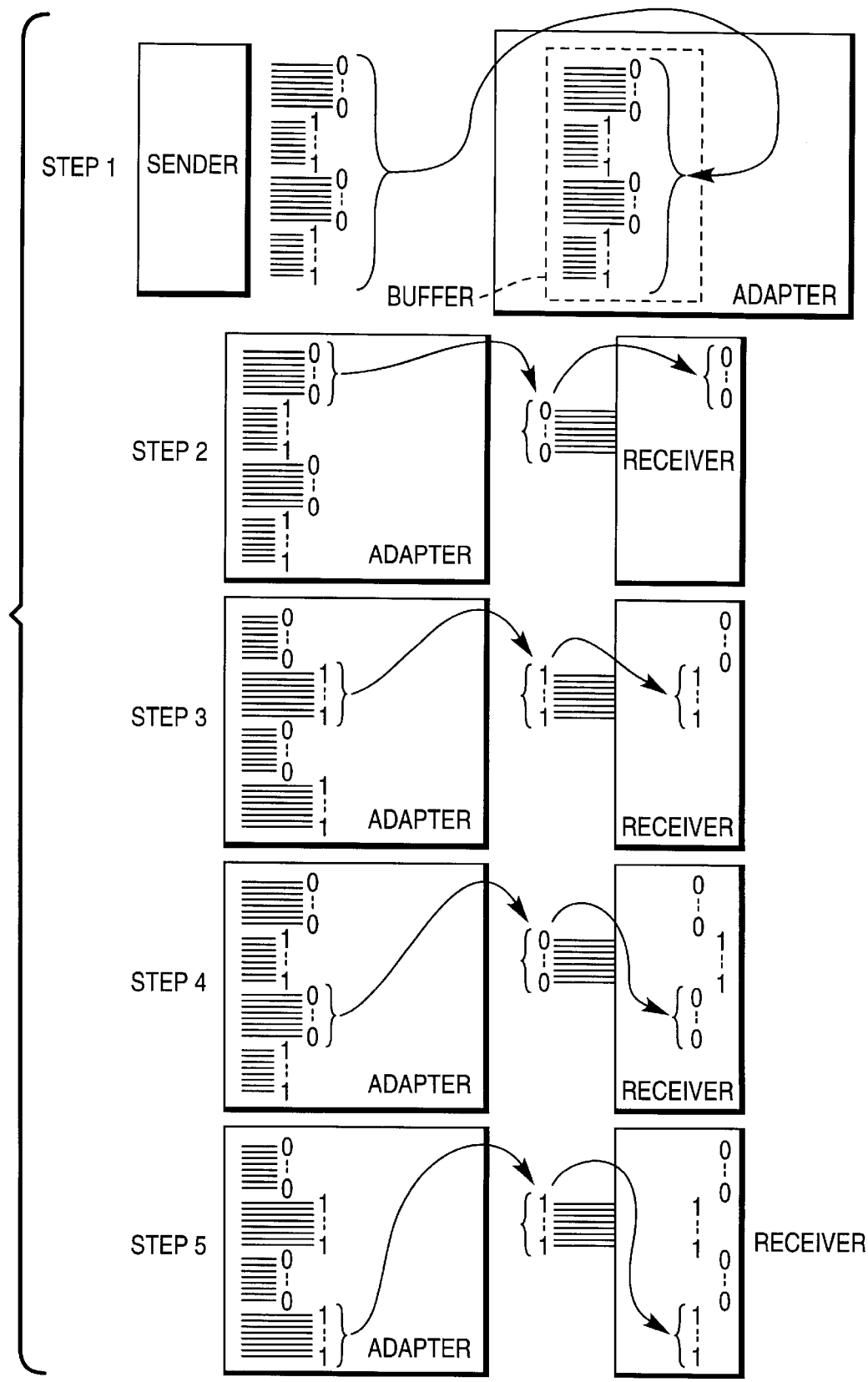
FIG. 3 illustrates how the approach of FIG. 2 can be improved by the use of a buffer.
Figure 5:
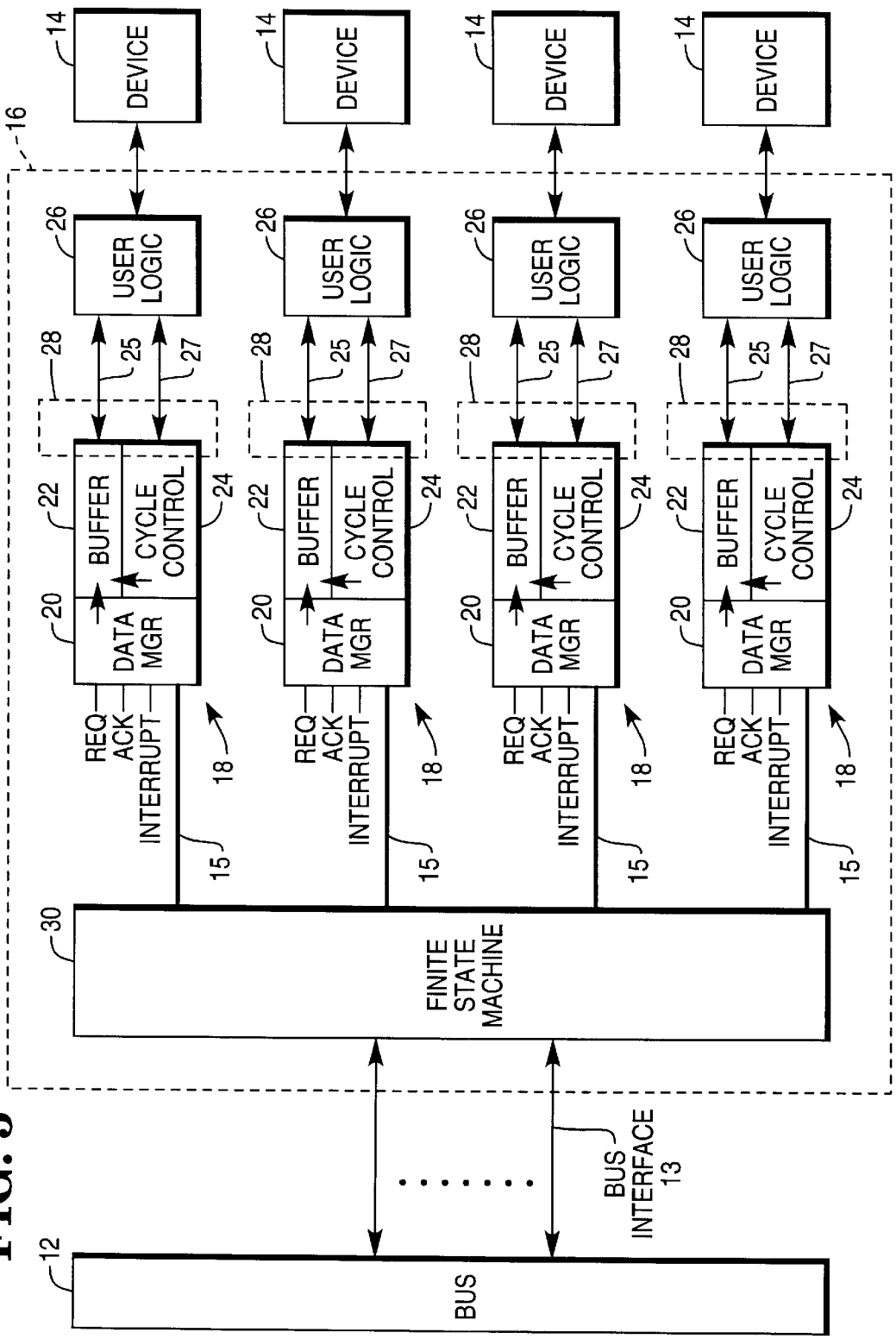
FIG. 5 is a more detailed overview of one form of the invention.

The invention includes a method for dynamically configuring a device adapter for interconnecting devices to a common bus. FIGS. 4 and 5 are views of the resulting apparatus for such connection. Several features are significant.

1. A bus 12 is shown. Typically, the bus is a system bus in a micro-computer. Devices 14 do not directly communicate with the bus. Instead, the devices 14 communicate with a device adapter 16. The invention provides a method and apparatus for generating a device adapter 16 which allows a given device 14 and the bus 12 to communicate with each other. The configurable macro has the flexibility of generating a device adapter that supports multiple devices all of the same type or class, or that supports multiple, dissimilar types of devices. Alternatively, and as a further exemplification of the flexibility of the present invention, the macro can be configured to provide separate device adapters for each interconnecting device (whether similar or dissimilar).

2. These devices 14 can include normal peripheral devices, such as disc drives and printers, which are normally connected to or within a computer. In addition, these devices can include other apparatus, such as the following:

video adapters, keyboards and pointing devices, multimedia adapters, memory controllers, memory and I/O cache, communication interfaces, and interfaces to other busses.

In principle, there is no fundamental limit to the types of apparatus which can act as a device 14 in FIG. 4.

3. In one embodiment, the generated device adapter presents a single load to the bus. One ramification of the single load concept is that the bus treats the device adapter, in general, as a single device. One exception is addressing: to select one of the four devices shown, the processor (not shown, but which is also connected to the bus) must supply an address to the device adapter which, in turn, selects the corresponding device. If the device adapter were, in all respects, viewed as a single device by the processor, then the device adapter would only possess a single address.

As a single load, the device adapter simplifies some overhead which the bus would otherwise incur.

4. The generated device adapter is "tunable". Further, the tuning is done for each type or class of device. In the preferred embodiment, within the device adapter, there are buffers (BUF) devoted to each device, as indicated in FIG. 5. Because, in general, each device has different buffering needs, during design the device adapter is optimized for the best, or at least a good, buffer design for each device.

Further, because of particular characteristics of the device adapter, to be discussed later, certain features of the buffers can be changed, without requiring alteration of other circuitry within the device adapter.

5. Data and control are separated within the macro. Interface control mechanisms are specified independently from the data paths in the macro. By specifying the data paths independently, the control signal interfaces between functional blocks can operate on a variety of data interchanges without special control structures. As an example, the transfer of data to/from an interface can be controlled in a similar fashion regardless of the length of the data transfer. The control interfaces operating in contractual agreement provide the mechanisms to initiate, terminate and monitor the data interchange without regard to the data contents.

MORE DETAILED DESCRIPTION OF THE INVENTION

The microfiche appendix submitted with this application contains a computer listing for the software (hereinafter called a macro) used in creating and generating a configurable device adapter. The macro requires a VHDL compiler. VHDL compilers are commercially available. VHDL is an acronym referring to VHSIC Hardware Description Language. VHSIC is an acronym referring to Very High Speed Integrated Circuit.

Applicants have used a commercially available VHDL compiler known as V-System VHDL Simulator and Compiler Platform Revision 2.5, available from Model Technology, located Beaverton, Oreg.

To design a customized device adapter, the macro is used in two different ways, namely, (1) in synthesizing a gate-level logic diagram, and (2) in simulating the circuit.

Synthesis

To perform synthesis, a user does the following:

1. The user specifies the following parameters:

The width of the device interface (e.g., 8, 16, or 32 bits).
The address size (i.e. number of bits) of the device interface.
The depth of the buffer contained in the device adapter (number of bits). The buffers are explained in greater detail later.
Buffer packing.

These parameters are specified by inserting them into the file labeled PCIMACRO_USER_PARAMS.VHD contained in the microfiche appendix.

2. The user compiles the design, using a commercially available synthesis engine such as Design Analyzer 3.0c, available from Synopsis Incorporated, Mountain View, Calif. For compilation, the user should load the macro files (listed in the microfiche) in the following order:

pcimacro_user_params.vhd, macro_pkg.vhd,
configurable_bit_reg.vhd, configurable_dword_reg.vhd,
clktree.vhd, signaltree.vhd, burst_size_cntr.vhd,
next_addr_cmpr.vhd, new_transfer_counter.vhd, control_reg.vhd,
dm_bk_sm.vhd, dm_fe_sm.vhd, data_manager.vhd,
address_counter.vhd, devsel_timer.vhd, master_latency_timer.vhd,
parity36.vhd, target_latency_timer.vhd, master_state_machine.vhd,
slave_state_machine.vhd, pci_fsm.vhd, cycler.vhd, cc_bk_sm.vhd,
cc_bypass_sm.vhd, cc_fe_sm.vhd, cycle_controller.vhd,
dpr_gen.vhd, pipeline_block.vhd, valid_data_counter.vhd,
address_pointer.vhd, buffer_element.vhd, memory_element.vhd,
output_latch.vhd, new_fifo.vhd, fifo.vhd,
byte_steering_logic.vhd, bist_reg.vhd, class_code_reg.vhd,
command_reg.vhd, device_id_reg.vhd, header_reg.vhd,
interrupt_line_reg.vhd, interrupt_pin_reg.vhd, max_lat_reg.vhd,
min_gnt_reg.vhd, revision_id_reg.vhd, status_reg.vhd,
vendor_id_reg.vhd, high_bit_reg.vhd, base_address_reg.vhd,
rom_base_address_reg.vhd, miscellaneous_configuration_regs.vhd,
config.vhd, bk_end.vhd, pci_macro.vhd, nan2.vhd, dffpq.vhd,
dffrpq.vhd, or2.vhd, hbuf.vhd, sbuf.vhd, inbuf.vhd, inpd.vhd,
inv.vhd, iobuf.vhd, iobufpci.vhd, iopd16.vhd, iopd12sl.vhd,
iobuf_iopd12sl.vhd, opd16.vhd, otpd16.vhd, bus_hbuf.vhd,
bus_inbuf.vhd, iopdpci.vhd, bus_inv.vhd, bus_opd16.vhd,
iobuf_iopd16.vhd, configured_pci_macro.vhd The product of the synthesis is a gate level diagram or netlist. A netlist is a description of how gate cells are connected together. An exemplary netlist is the following:

AND1 2 4 10
OR1 10 12 14

This list indicates that AND gate 1 has two inputs. One is connected to node 2, and the other is connected to node 4. The output is connected to node 10. The list indicates that OR gate 1 has two inputs. One is connected to node 10 (which is the output of the AND gate) and the other is connected to node 12. The output is connected to node 14.

Therefore, the synthesis engine, together with the macro and specified parameters, synthesize a gate level diagram. Synthesis requires a cell library, which provides the building blocks for the gate-level circuit. A selected cell library is used for a given technology (e.g. CMOS, bipolar, etc.). Cell libraries are commercially available, and are known in the art. The preferred cell library is the NCR VS500 standard cell library, available from AT&T Global Information Solutions Company in Dayton Ohio.

This gate-level diagram will, ultimately, be fabricated into one or more integrated circuits and/or cards which implement the device adapter.

Simulation

Prior to fabricating the integrated circuits, two types of simulation are performed. A functional simulation is performed prior to synthesis, and a gate-level simulation is performed after synthesis. To perform functional simulation, the user specifies the parameters, as in the synthesis step above, and then compiles and simulates the macro using a compiler/simulator such as the V-System VHDL Simulator and Compiler Platform, available from Model Technology, Beaverton, Oreg. Gate-level simulation is performed, after synthesis, to generate test vectors which will be used in testing the circuit after fabrication. To perform gate-level simulation, a gate-level diagram or netlist (as generated from the synthesis step) is input to a physical design simulator such as the Verilog Simulator available from Cadence Design Systems Inc., San Jose, Calif. (and whose corporate office is located in Lowell, Mass.).

Routing

After synthesis and simulation, the netlist generated by the synthesis step is processed by a routing program, such as Tancell version 2.4.0, which is also available from Cadence Design Systems. The routing program produces a machine language representation of each layer of the integrated circuit to be fabricated. In effect, the routing step produces multiple layout diagrams, each of which describes a different level of topology of the integrated circuit to be fabricated.

The product/output of the routing step is a database. This database is then used to generate the masks used in fabrication of the integrated circuits, using techniques commonly known in the art.

Figure 12:
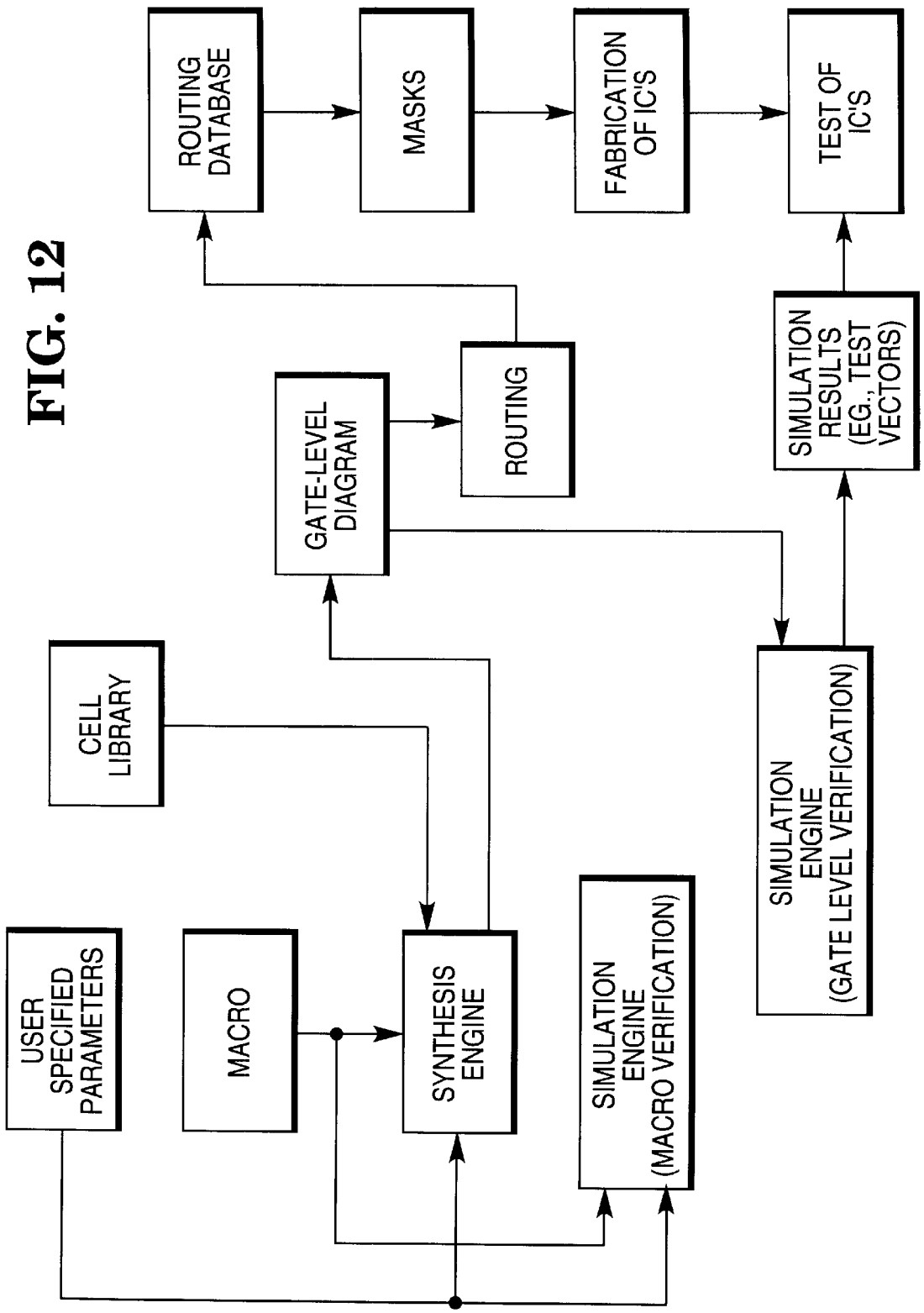
FIG. 12 is a process flow diagram for the design and manufacture of integrated circuits using the tunable macro.

Once the masks are generated, one or more integrated circuits are fabricated, using techniques commonly known in the art. The overall process flow is illustrated in FIG. 12. It should be noted that adapter cards can also be built using similar physical layout design tools and techniques commonly known in the art.

Schematic of Tuned Architecture

FIG. 5 illustrates an overview of the resulting gate-level schematic, grouping the gates according to task or function. That is, for each device sub-adapter:

one group of gates will operate as a data manager (DATA MGR);

one group of gates will operate as a buffer (BUFFER);

one group of gates will operate as cycle control logic (CYCLE CONTROL); and one group will operate (optionally) as user logic (USER LOGIC).

As FIG. 5 indicates, each device sub-adapter 18 has its own data manager 20, buffer 22 and cycle controller 24, all of which were generated in the synthesis step. The optional user logic 26 is defined by the user, independent of the macro, for adapting a given device 14 to the back end interface 28 of the device sub-adapter 18. The user logic comprises such things as simple gating, device specific logic, or any other special requirements, such as synchronizing all signals presented to, or received from, the back end interface (if necessary for a particular device). In addition, the macro generates a single finite state machine (FSM) 30 which deals with all data managers for a particular device adapter integrated circuit or card 16.

The blocks of FIG. 5 operate generally as follows (some exceptions will be noted later).

The data manager 20 controls data transfers between the bus 12 and the buffer 22. That is, the bus 12 (through the finite state machine) deals with the data manager. The data manager has three control lines (Request, Acknowledge and Interrupt) coupled to the bus via bus interface 13, and an internal bus 15 coupled to the finite state machine 30.

The buffer 22 holds the data temporarily. The buffer is preferably of the First-In, First-Out (FIFO) type.

The cycle control logic 24 controls data transfers between the back end device 14 and the buffer. That is, the device (perhaps through the User Logic) deals with the cycle control logic. In a sense, the data manager and the cycle control logic cooperate to perform data transfers: the former deals with the bus, and the latter deals with the back end device.

A single finite state machine 30 controls all data managers 20 for a given IC or card 16. The primary function of the finite state machine is to arbitrate contention between devices 14. That is, if two devices 14 attempt to communicate with the bus 12 simultaneously, the finite state machine requires one of them to wait.

Functional Blocks within Macro

The macro is composed of a set of functional blocks (e.g. finite state manager, data manager, buffer, cycle controller) which are themselves expandable. The interfaces between these functional blocks are contractual, or rule-based, interfaces with variable timing and word width specifications. For example, a buffer block could be configured to have either a 1 byte deep FIFO or a 4K byte deep FIFO, without changing the interface contracts/rules. It is therefore possible to configure a variable data width path for buffers without changing the cycle controller interface contract. In this way, the cycle controller would still perform its functions in a data independent way.

Data and control are separated within the macro. Interface control mechanisms are specified independently from the data paths in the macro. By specifying the data paths independently, the control signal interfaces between functional blocks can operate on a variety of data interchanges without special control structures. As an example, the transfer of data to/from an interface can be controlled in a similar fashion regardless of the length of the data transfer. The control interfaces operating in contractual agreement provide the mechanisms to initiate, terminate and monitor the data interchange without regard to the data contents. That is to say, no control operations are contained in the data stream. All control operations involving cooperating functional blocks are contained in the control interfaces.

The internal bus having separated data 25 and control 27 paths is shown in FIG. 6. The internal bus 32 is coupled to internal interfaces (I/F) for the finite state machine 30, data manager 20, buffer 22, and cycle controller 24 functional blocks. The external bus interface 13 similarly has separated data and control, as indicated by the thin (control) and thick (data) lines between the FSM 30 and the bus 12. The exported I/F 29 corresponds to the conglomeration of all back end interfaces 28 of FIG. 5. FIG. 6 also shows multiple instantiations for the various functional blocks (except for the FSM, of which only one exists for a given device adapter, as previously described). Each instantiation of a functional block also has an interface I/F which couples the particular functional block to the internal device adapter bus.

A detailed description for each functional block of FIG. 5 follows.

Bus Interface/Finite State Machine

The macro generates a single bus interface for a given device adapter. This bus interface provides the electrical interface between the bus 12 and the device adapter IC or card 16. The bus interface couples the bus to a finite state machine which manages data flow between the bus and the (one or more) data manager(s). The key component of the bus interface function is contained in the module named PCI_FSM (or front end bus finite state machines). There are two independent state machines within the finite state machine 30 which are responsible for bus interface operations, one for slave operations and one for master operations. Each of the master/slave state machines perform bus interface functions.

As an example of the slave state machine, when the bus 12 is in an address phase, the configuration logic (as generated by the config.vhd macro file listed in the microfiche appendix) will indicate a back end device is being accessed. As soon as access is determined to belong to one of the backend device interfaces to the macro, the address on the bus is loaded into an internal address register within the finite state machine. The bus cycles are then translated into internal control signals for the internal bus 32 of FIG. 6. For each subsequent data phase, the configuration logic must still validate the internal address.

When a back end device 14 requests and is granted the bus, the master state machine outputs the internal address on the bus data pins, and asserts the proper bus signals to start a bus transfer. Once the finite state machine detects a valid bus cycle, the finite state machine will start issuing data phases to the bus 12.

The only macro resource that is shared among multiple data manager and cycle controller interfaces is the finite state machine 30. This guarantees that only one back end resource will be granted bus access at the appropriate time. Backoffs to back end devices will be issued if the bus resource is busy.

Data Manager/Cycle Controller Pairs

The device sub-adapter 18 is structured so that cycle control and data management facilities work in pairs. Therefore, each back end interface 28 that is substantiated for a given device sub-adapter 18 necessitates the parameterization and inclusion of a data manager 20 and cycle controller 24 block pair (along with the buffer block(s)). Data transfers to/from device sub-adapter configured buffers and the front end and back end buses are orchestrated by the data manager and cycle controller, through contractual interfaces.

Each buffer configured into the macro requires a separate data manager. If a configuration is desired where the READ/WRITE buffers are to be separated and independent, then two data managers are necessary, one for the READ direction, and another for the WRITE direction. The cycle controller facility orchestrates all data transfers to/from internal buffers and the back end interface through its contractual interfaces with other cooperating functional blocks or exported interfaces. In this way, the data paths can be specified independently from the control paths, allowing the data paths to be width configured to support multiple width devices without changing control interfaces. Likewise, buffering for those data paths can also be configured without changing control interfaces.

BUFFERS

Since the macro architecture is configured and extensible, the buffer management facilities of the macro can be parameterized to provide several buffering options. In general, the depth of internal buffering must be decided given system constraints, bus latency, interrupt service overhead, cache line size, device compliment and overall system performance targets. The macro therefore will implement mechanisms to tune the buffering to meet system goals. Buffers are FIFO organizations and are not directly addressable. Almost Full and Almost Empty flags are programmable. Buffers are dual ported. The following rules apply to buffer sizing:

1) Buffers are width extensible in 8, 16, and 32 bits. If packing is desired, the buffer width should be 32 bits.
2) If split send and receive data paths (i.e. unidirectional buffers) are desired, the number of buffers in each path should be equal (i.e. the number of read and write buffers should be the same).
3) Each individual buffer depth should be a power of 2 and all buffers for each unidirectional path should be sized the same.
4) The buffer depth should be greater than or equal to the bus transfer size programmed in the data manager.
5) The Almost-full and Almost-empty flags should be the same, evaluated equally for each unidirectional buffer (s), and should be sized at integer multiples of the bus transfer size (i.e. cache line size as an example). Buffer widths are extensible in 8, 16, and 32 bits. Direct accesses to back end devices should be commensurate with the data width of the back end device.

For cases where separate read and write buffers are desired, the address for reads and writes from the back end interfaces (usually issued by back end devices) are required to be buffered in parallel with the data for those same cycles. This permits the data manager to recover from retries and aborts issued on the bus by other masters or targets.

The data manager controls movement of data to/from PCI bus to/from buffers regardless of the data width. Size mismatches between bus width and the back end are not accommodated except in the case of buffer packing. Byte Enables are also stored in the buffers for steering.

Buffer packing is done on a byte basis to take advantage of the 32 bit bus. Packing is done as follows:

2 bytes per 16 bit data field, with 2–16 bit data fields per 32 bit PCI word 4 bytes per 32 bit bus width doubleword No other byte packing options are supported. Buffer packing will occur prior to buffer fill so that the data in the buffer will be in packed order for transfer to the bus or situated in the buffer for unpacking and steering to the back end interface. No data packing on the back end interface is supported.

Figure 7:
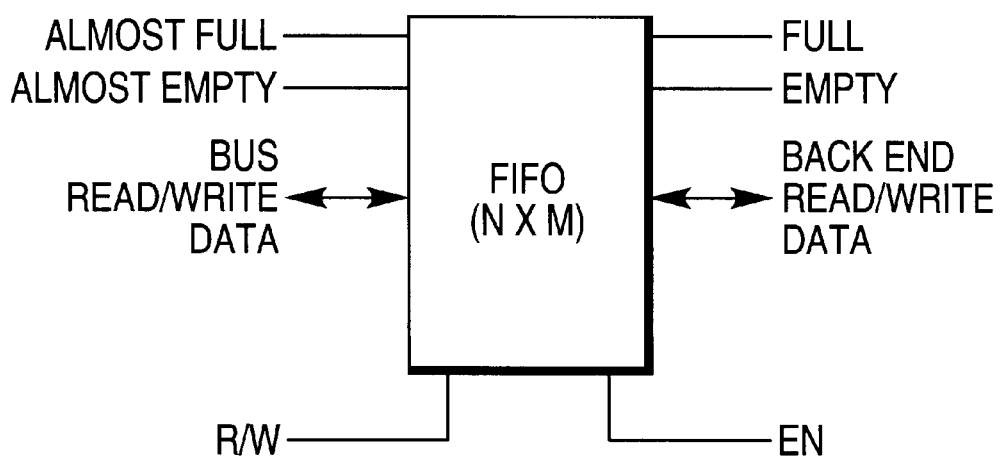
FIG. 7 shows a buffer configured as unidirection read/write.
Figure 8:
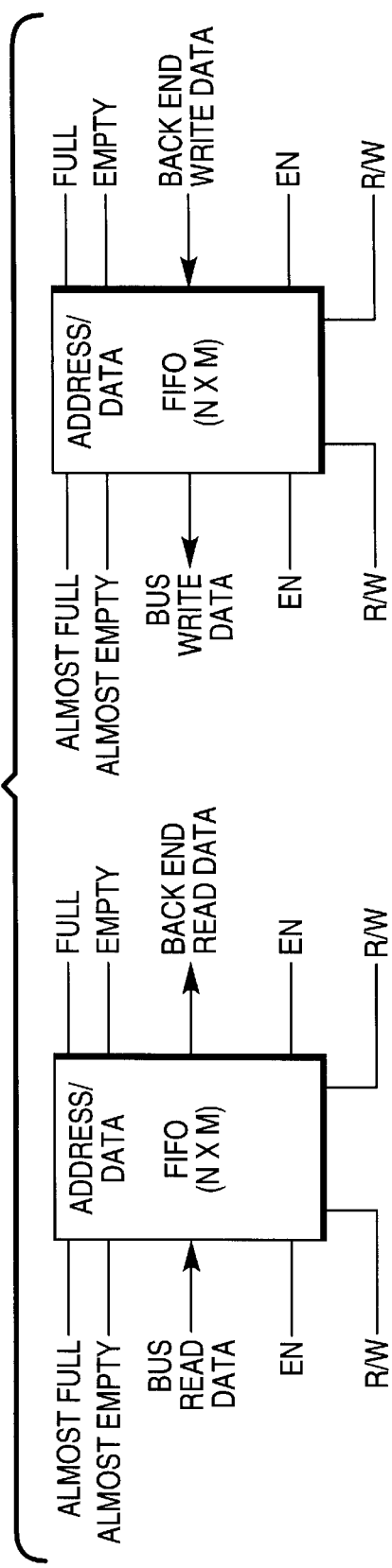
FIG. 8 shows buffers configured as separate read and write buffers.
Figure 9:
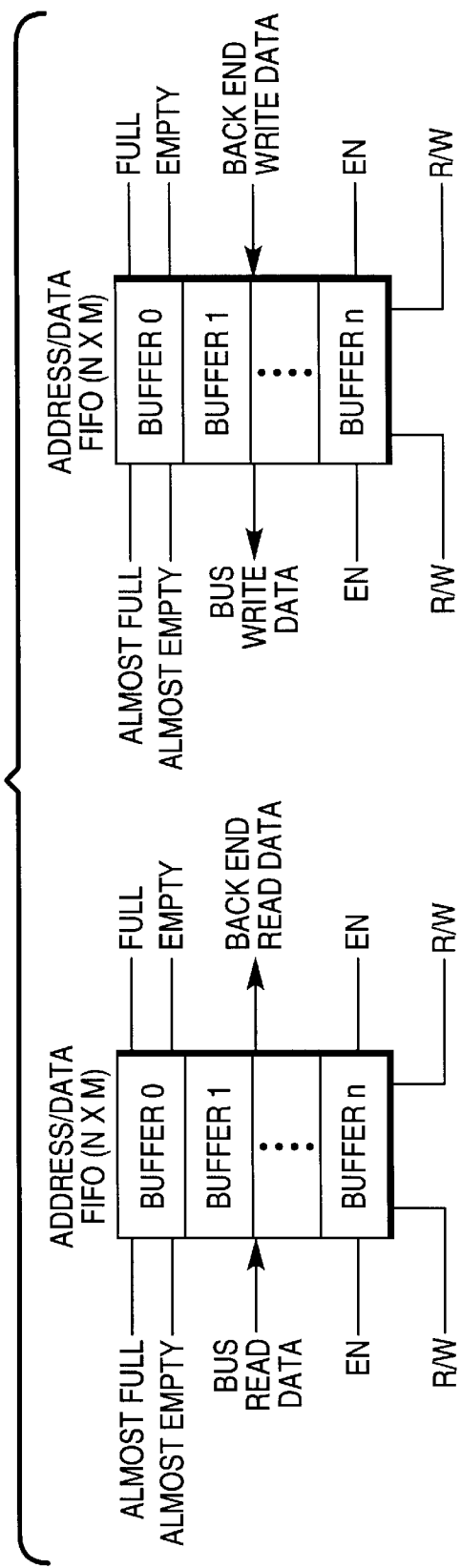
FIG. 9 shows multiple buffers configured as ping-pong or circular buffers.

Multiple buffering configurations are supported for the FIFO, and can be configured as follows:

1) As shown in FIG. 7, buffers can be configured as unidirectional read/write (i.e. single buffer)
2) As shown in FIG. 8, buffers can be configured as separate read and write buffers (i.e. 2 separate buffers)
3) As shown if FIG. 9, multiple buffers (buffer 0–n) can be configured as ping-pong or circular buffers (i.e. 2 or more buffers for read, and 2 or more buffers for write)

Back End Interfaces

Each back end interface is a generic address and data interface. The notion of "generic" address and data interfaces is defined as a set of signals necessary to perform back end interfacing to devices. There are several types of generic interfaces that can be configured. These include mastering interfaces which use request/grant protocols, mastering interfaces which use hold and hold acknowledge protocols, DMA slave interfaces which use request/grant for slave operation protocols, and simple slave interfaces which use direct access protocols. Each back end interface can be configured with any of the types of "generic" interface mechanisms described above. In addition, the data specific characteristics of a device can also be configured, such as the data width, address width, byte enable width, etc. This is done by appropriate setting of the user specified parameters in the PCIMACRO_USER_PARAMS file.

The exported back end interfaces are generic address and data buses, as described above. Separate input and output address and data buses are provided. These buses are split, fully synchronous and continuously driven in the preferred embodiment. Asynchronous interfaces will need to be accommodated in the user interface logic block external to the macro. No tri-state buses are exported from the macro. This means that the signal states are continuously driven to a known logic value (either=0, or=1).

Split bus means that the data-in connection and data-out connection require separate sets of signal paths. This is in contrast to a bus which is of the tri-state variety. In a tri-state bus, there is only a single data path connection where the direction can either be in or out. The split bus also applies to the address path connections, and the byte enable path connections.

The cycle controller is responsible for all back end interface operations. The types of cycles supported by the cycle controller are identified below, and include slave back end, slave DMA (single cycle), slave DMA (multiple cycle), master back end interface, DMA (single cycle), and DMA (multiple cycle).

Slave cycles are supported by the macro for 8, 16 and 32 bit interfaces. Slave cycles are intended to be issued from alternate masters on the bus. No peer-to-peer slave cycles are supported other than those destined for the bus. Back end peer-to-peer slave cycles are not supported. Read and Write cycles, whether DMA directed or not, are supported on the back end interface. Direct slave cycles are configured to bypass the internal FIFO if desired. The implementation should be cautious in this case as the macro assumes no data integrity management, except for data transferred to the internal buffers, and does not support out of order transfers to back end interfaces.

Back end single cycle DMA slave accesses are supported by the cycle controller. The cycle controller watches back end bus turnaround and DMA slave cycle terminations when transferring data into particular FIFO organizations. Both DMA directed READ and WRITE are supported.

Multi-cycle slave directed DMA is supported by the cycle controller for back end interfaces. Multi cycle DMA requires that the back end interface maintain ownership of the bus for the duration of the transfer. Anytime the back end interface control is given up, the current DMA cycle is assumed to have terminated. The next restart of a multi-cycle DMA necessitates re-arbitration of the bus, and possible reprogramming of the data manager DMA registers.

Master devices are supported as a back end interface. Masters can be configured with full buffer support, or minimal support or no buffering. Sophisticated Masters which contain integrated DMA capability will want to use a simple data manager which would run in a buffer bypass mode to be less intrusive. A data manager and cycle controller pair are still required, however Master DMA single cycles cause a PCI arbitration for each back end interface DMA single cycle. This applies to both read and write DMA cycles.

Multiple cycle DMA back end cycles are supported with both address and data stored in the internal buffers.

The back end interface has a data path which is width configurable to support devices having 8, 16, and 32 bit data paths. Internal data paths reflect the back end device data width in all cases except where buffer packing is enabled.

It is also possible to configure the data paths to include buffering. This is done by the user specifying in the PCIMACRO_USER_PARAMS file the number of buffers desired, and the depth of each buffer.

The back end address bus is also width configured to the device to be interfaced. Both address_in and address_out buses are provided.

Both master and slave burst transfers are supported, as follows:

For master burst transfer, write to the bus from back end masters are presented in two fashions:

1) For non-sequential addresses (both address and data stored in the internal buffers), each write is presented as a single cycle.
2) For sequential addresses, the write is burst across the bus in a burst transfer.

For slave burst transfer, transfers to back end interfaces need data buffering only, unless the back end has address requirements as well. Direct accesses bypass the internal buffers. Direct accesses have priority over buffered accesses.

Example of Operation

The following example illustrates important principles of the present invention. Assume that the device is a rotary position encoder, which produces an eight-bit word indicative of the rotary position of a shaft. A micro-computer, containing a bus, wishes to ascertain the eight-bit number at different times.

A device adapter is manufactured and installed, by using the macro as outlined above. To obtain the eight-bit number, the micro-computer places the address of the device (i.e., the rotary position encoder) on the bus. The finite state machine within the device adapter selects the data manager and cycle controller pair corresponding to the device.

The cycle controller tells the user logic to read the eight-bit word in the position encoder (the particular sequence of signals required for this event will depend on the particular encoder used). The user logic responds, reads the position encoder, and loads the eight-bit word into the buffer. The data manager sees the eight-bit word in the buffer, and inquires whether other devices are contending for the bus. If no contention exists, the data manager places the eight-bit word on the bus. The micro-computer's processor now has access to the rotary position. If the micro-computer wishes an update of the position information, it repeats this sequence.

Additional Considerations

Figure 10:
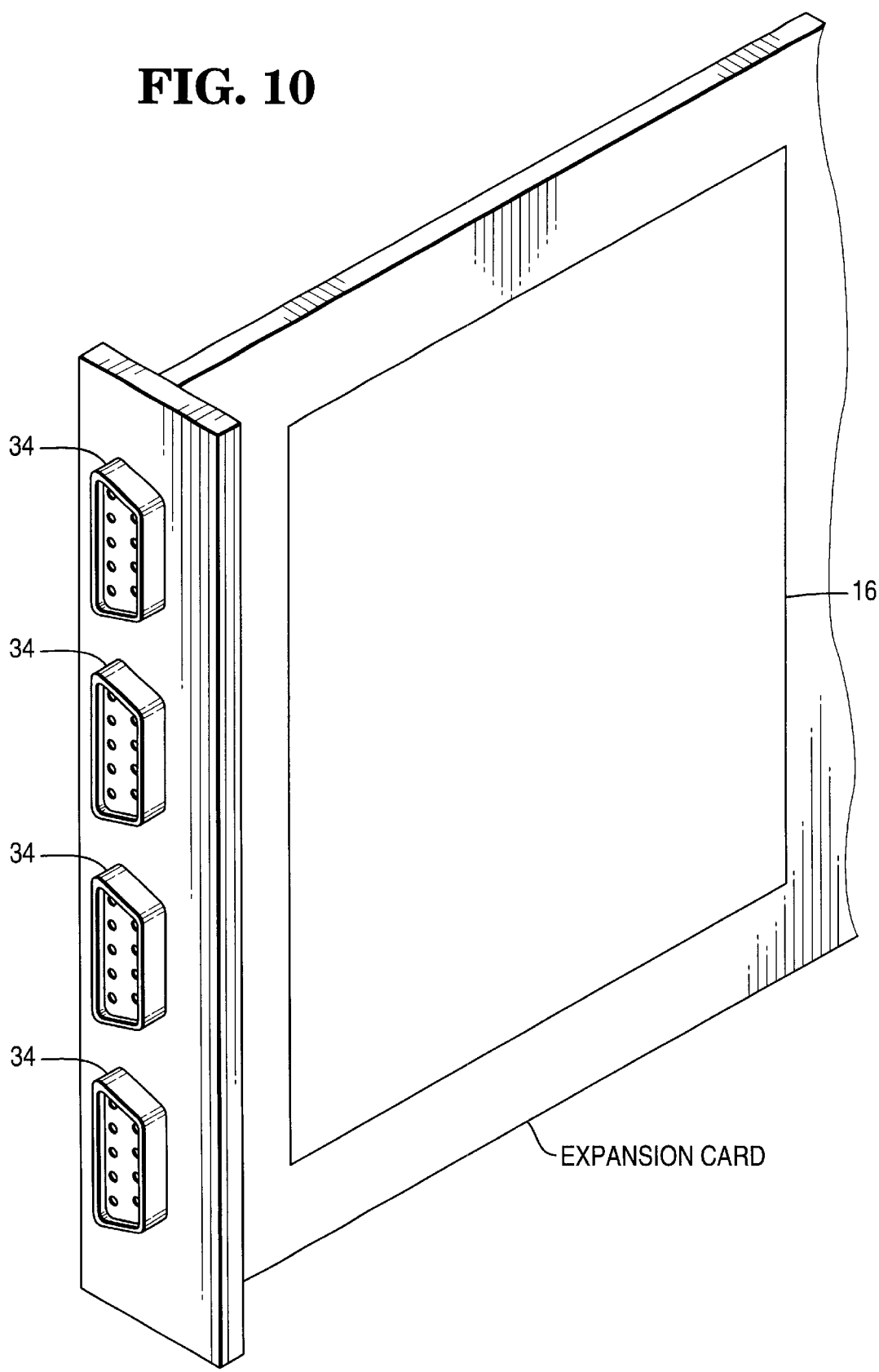
FIG. 10 illustrates a system board, for a computer, which contains the device adapter apparatus of FIG. 5.
Figure 11:
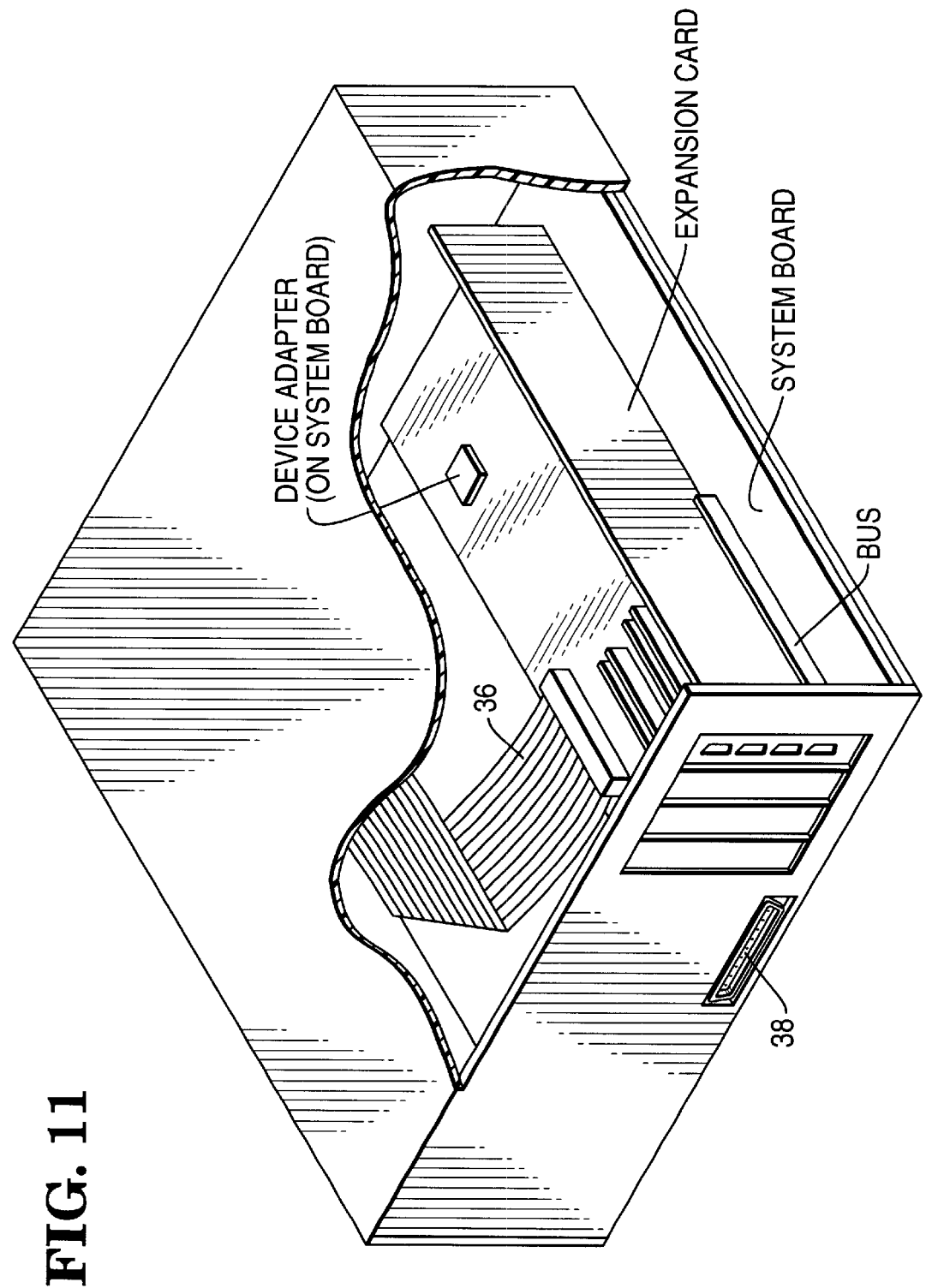
FIG. 11 illustrates an expansion card, for a computer, which contains the device adapter apparatus of FIG. 5.

1. The device adapter shown within the dashed box 16 of FIG. 5 can be constructed on an expansion card as shown in FIG. 10. This expansion card can then be inserted into an expansion slot in a micro-computer, as shown in FIG. 11. As known in the art, the expansion slot is actually an edge-connector which leads to the system bus of the computer. The expansion card contains multiple C connectors 34, as shown in FIG. 10, one for each device to be connected. If the user logic in FIG. 5 is located on the expansion card itself, the expansion card provides different interfaces for each device. Each interface is represented by one of the C connectors shown in FIG. 10.

Alternatively, the device adapter 16 of FIG. 5 can be installed onto the system board of the computer, as shown in FIG. 11. The device adapter connections are directly with the system bus (i.e. bus 12 of FIG. 5). Devices attach to the system board using traditional interconnect techniques, such as a ribbon cable.

The device adapter shown within the dashed box 16 of FIG. 5 can be constructed on a single integrated circuit (IC) or multi-chip module (MCM) when the number of attaching devices is limited to a relatively small number such that the available I/O pins of such IC or MCM are not exceeded. This IC or MCM could then been installed as described above (e.g. on the system board or expansion card).

2. FIG. 5 illustrates user logic which is used to adapt a given device with the back end interface. Existing devices can be interfaced to the macro by:

A. Replacing the existing specifications for the BUS with those for the back end interface.

B. Replacing the existing specifications for the back end interface with those for the device interface.

After making these replacements, which involve modifying the files cycle_controller.vhd and bk_end.vhd (which are listed in the microfiche appendix), the back end interface will conform to the device's characteristics.

3. The device adapter interfaces the devices of FIG. 5 with the bus. The bus communicates with the respective buffers (via the buffers' respective data managers) at different times.

4. A particular characteristic of the macro is important. The macro creates designs for the data manager, buffer, and cycle control logic to be compatible with the back end interface. This compatibility persists, even if the parameters for the buffers are changed, and the macro is run a second time, producing a second functional block logic circuit. The second circuit is still compatible with the back end interface, and with the previous cycle control logic.

5. The macro allows specification of the following types of data manager:

0 Back End Slave Device, Unbuffered (almost no DATA MANAGER functionality).
1 Bidirectional Slave DMA Engine (Includes peer-to-peer).
2 Slave DMA Engine for Writing to the Bus 12.
3 Slave DMA Engine for Reading from the Bus 12.
4 Unbuffered Master, Read and Write (simple data manager functionality).
5 Buffered Read Master, Random Access.
6 Buffered Read Master, Sequential Access.
7 Buffered Write Master, Random Access.
8 Buffered Write Master, Sequential Access.
9 Buffered Bidirectional Master, Sequential Access.

6. In the preferred embodiment, the bus 12 is a PCI bus, and carries the following signals, as further described in Peripheral Component Interconnect Specification Rev 2.0—Apr. 30, 1993 and PCI IDE Addendum Rev 0.6 (in review by PCI SIG Committee)—Jan. 12, 1994 (both of which are available from PCI Special Interest Group, 5200 N.E. Elam Young Parkway, Hillsboro, Oreg. 97124), both of which are hereby incorporated by reference as background material.

CLK:
   PCI System Clock input.
RST#:
   PCI Reset. All PCI device output signals driven to tri-state asychronously.
AD(31:0):
   PCI Address and Data multiplexed.
C_BE(3:0):
   PCI Bus Command and Byte Enables multiplexed.
PAR:
   PCI Parity.

FRAME#:
   Cycle Frame, which is driven by the current bus master and specifies the beginning and duration of a bus access.
IRDY#:
   Initiator Ready, which indicates the initiating bus master's ability to complete the current transaction data phase. For a data phase to complete, both IRDY# and TRDY# must be active on a clock edge.
TRDY#:
   Target Ready, which indicates a target agent's ability to complete a transaction data phase. For a data phase to complete, both IRDY# and TRDY# must be active on a valid clock. For a READ, TRDY# indicates valid data on AD(31:0). For a WRITE, TRDY# indicates the target can accept the data.
STOP#:
   Stop, which requests the current transactions initiator to stop the transaction.
IDSEL:
   Initialization Device Select, which is used as a chip select for configuration transactions.
DEVSEL#:
   Device Select, which indicates that a target device has decoded the address and is the target for the current transaction.
PERR#:
   Parity Error, which is used for reporting DATA parity errors only. PERR# can only be driven after an agent has claimed a transaction by asserting DEVSEL.
SERR#:
   System Error, which is used for reporting ADDRESS parity errors. Since Special Cycles are not supported by the macro, data parity is not reported on Special Cycles using this signal.

7. The signal interface for the PCI_FSM (finite state machine) module are shown below:

| | |
|---|---|
| PCI_CLK | The System Clock (PCI Bus appears synchronous) |
| PCI_RST | The System Reset from front end bus |
| PCI_AD_IN | Address Lines |
| PCI_AD_OUT | |
| PCI_AD_OEb | |
| PCI_CNTL_BEb_IN | Control Lines |
| PCI_CNTL_BEb_OUT | |
| PCI_CNTL_BE_OEb | |
| PCI_FRAMEb_IN | Valid Cycle |
| PCI_FRAMEb_OUT | |
| PCI_FRAMEb_OEb | |
| PCI_TRDYb_IN | Target Ready |
| PCI_TRDYb_OUT | |
| PCI_TRDYb_OEb | |
| PCI_IRDYb_IN | Initiator Ready |
| PCI_IRDYb_OUT | |
| PCI_IRDYb_OEb | |
| PCI_STOP_IN | Target Terminate |
| PCI_STOP_OUT | |
| PCI_STOP_OEb | |
| PCI_DEVSELb_IN | Device Select |
| PCI_DEVSELb_OUT | |
| PCI_DEVSELb_OEb | |
| PCI_IDSELb | ID Select |
| PCI_LOCKb | Exclusive Access Lock |
| PCI_PERRb_IN | Parity Error |
| PCI_PERRb_OUT | |
| PCI_PERRb_OEb | |
| PCI_SERRb_IN | System Error |
| PCI_SERRb_OUT | |
| PCI_SERRb_OEb | |
| PCI_PAR_IN | Parity |
| PCI_PAR_OUT | |
| PCI_PAR_OEb | |

8. The back end interface carries the following signals:

| | |
|---|---|
| BK_ADDR_IN | Address lines |
| BK_ADDR_OUT | |
| BK_ADDR_OUT_EN | |
| BK_DATA_IN | Data Lines |
| BK_DATA_OUT | |
| BK_DATA_OUT_EN | |
| BK_BEb_IN | Byte Enable Lines |
| BK_BEb_OUT | |
| BK_BYTE_OUT_EN | Enable for Byte Lines |
| BK_AS_IN | Address Strobe |
| BK_AS_OUT | |
| BK_DS_IN | Data Strobe |
| BK_DS_OUT | |
| BK_RD_WRb_IN | Read/Write Direction |
| BK_RD_WRb_OUT | |
| BK_MEM_IOb_IN | Memory / I/O |
| BK_MEM_IOb_OUT | |
| BK_C_Db_IN | Command/Data |
| BK_C_Db_OUT | |
| BK_SLAVE_CS | Slave Chip Select |
| BK_DRQ | Data Request |
| BK_DACK | Data Acknowledge |
| BK_TC | Transfer Count Complete |
| BK_REQ | Request Bus |
| BK_GNT | Grant Bus |
| BK_RDY_IN | Ready |
| BK_RDY_OUT | |
| BK_HOLD | Hold |
| BK_HLDA | Hold Acknowledge |
| BK_MASTER_REQ | Master Request |
| BK_MASTER_GNT | Master Grant |
| BK_RESTART | Restart Device |
| BK_IRQ_HOLD_OFF | Interrupt Hold Off |

9. The following TABLE 1 depicts the file hierarchy for the macro files contained in the microfiche appendix.

TABLE 1

Hierarchy of Macro Modules

User parameter selection files:

pcimacro_user_params.vhd
macro_pkg.vhd
Macro Hierarchy file description:

configured_pci_macro.vhd - TOP level design file
    pci_macro.vhd - primary PCI Macro interface level
        pci_fsm.vhd - PCI Bus finite state machine level
            address_counter.vhd -   32 bit address counter
            devsel_timer.vhd - Device Select Timer
            parity36.vhd - Parity Generator
            target_latency_timer.vhd - Target Latency Timer
            master_state_machine.vhd - Frontend Master State Machine
            slave_state_machine.vhd - Front End Slave State Machine
        config.vhd - Configuration block level - PCI Specific registers
            bist_reg.vhd
            class_code_reg.vhd
            command_reg.vhd
            device_id_reg.vhd
            header_reg.vhd
            interrupt_line_reg.vhd
            interrupt_pin_reg.vhd
            max_lat_reg.vhd
            min_gnat_reg.vhd
            revision_id_reg.vhd
            status_reg.vhd TABLE 1-continued Hierarchy of Macro Modules vendor_id_reg.vhd
            high_bit_reg.vhd
            base_address_reg.vhd
            rom_base_address_reg.vhd
            control_reg.vhd
            miscelaneous_configuration_regs.vhd
            master_latency_timer.vhd
bk_end.vhd - backend interface level
    data_manager.vhd - data manager block
        burst_size_cntr.vhd - Burst Transfer counter
        next_addr_cmpr.vhd - Next address comparator
        new_transfer_counter.vhd - Transfer counter
        dm_bk_sm.vhd - data manager backend state machine
        dm_fe_sm.vhd - data manager frontend state machine
    fifo.vhd - FIFO block level
        dpr_gen.vhd - Dual Port RAM generator
        pipeline_block.vhd - Dual Port RAM pipeline regs
        valid_data_counter.vhd - Valid data counter
        address_pointer.vhd - Dual Port RAM address pointer
        buffer_element.vhd - Used when buffers built with
            registers
        memory_element.vhd - This is the definition of the
            memory to be used
        output_latch.vhd - Output latches in data path from
            Dual Port RAM
        new_fifo.vhd - FIFO interface
    cycle_controller.vhd - cycle controller level
        cycler.vhd - cycle controller state machine
            interface
        cc_bk_sm.vhd - cycle controller backend state
            machine
        cc_bypass_sm.vhd - cycle controller bypass
            controller
        cc_fe_sm.vhd - cycle controller front end state
            machine
    byte_steering_logic.vhd - Byte Steering logic
General configured register files:

configurable_bit_reg.vhd
configurable_dword_reg.vhd
Misc. I/O, gate level library files and clock tree files:

| | |
|---|---|
| clktree.vhd | Clock tree generator interface |
| signaltree.vhd | Signal tree generator interface |
| nan2.vhd | NAND gate |
| dffpq.vhd | flip-flop |
| dffrpq.vhd | flip- flop |
| dff_iobuf_iopd16 | flip-flop I/O buffer cell |
| or2.vhd | OR gate |
| hbuf.vhd | HBUF gate |
| sbuf.vhd | SBUF gate |
| inbuf.vhd | Input buffer gate |
| inpd.vhd | Input pad |
| inv.vhd | Inverter gate |
| iobuf.vhd | I/O buffer gate |
| iobufpci.vhd | special PCI pad buffer |
| iopd16.vhd | IOPD16 I/O cell |
| iopd12sl.vhd | IOPD12SL I/O cell |
| iobuf_iopd12si.vhd | IOBUF + IOFD12SL cell |
| iobuf_iopd16.vhd | IOBUF + IOPD16 cell |
| opd16.vhd | OPD16 cell |
| otpd16.vhd | OTPD16 cell |
| bus_hbuf.vhd | bused HBUF cells |
| bus_inbuf.vhd | bused input buffer cells |
| bus_inpd.vhd | bused input pad cells |
| bus_inv.vhd | bused inverter cells |
| bus_opd16.vhd | bused OPD16 cells |
| iopdpci.vhd | Special PCI I/O cell |

10. The following TABLE 2 describes briefly the operation of the files contained in the microfiche appendix.

TABLE 2

Description of Macro Modules address_counter.vhd
    A 32-bit counter. A 32-bit initial address can be loaded
    into it. When it is enabled, it increments the address by
    one. Loading and incrementing only occur when the clock
    ticks.
address_pointer.vhd
    Generates address logic for the FIFO memory elements.
base_address_reg.vhd
    PCI-specific register for base_reg
bist_reg.vhd
    PCI-specific register for bist.
bk_end.vhd
    A description of the back end interface. All of these
    signals are synchronous.
buffer_element.vhd
    This creates some logic to be associated with a FIFO block.
    It creates some space to hold a few data items and some
    address_pointers for reading and writing.
burst_size_cntr.vhd
    This 8-bit counter is used to control the length of burst
    transfers that are backed-off or retried so they may
    continue with the proper count when they are able to
    complete.
bus_hbuf.vhd
    Cell library file for HBUF cells; used for simulation and
    synthesis.
bus_inbuf.vhd
    Cell library file for INBUF cells; used for simulation and
    synthesis.
bus_inpd.vhd
    Cell library file for INPD cells; used for simulation and
    synthesis.
bus_inv.vhd
    Cell library file for INV cells; used for simulation and
    synthesis.
bus_opd16.vhd
    Cell library file for OPD16 cells; used for simulation and
    synthesis.
byte_steering_logic.vhd
    This is the data path for Byte Steering. It handles
    steering of all bytes of the data buses.
cc_bk_sm.vhd
    This is the cycle controller state machine for the back end
    interface. Certain parts of this drop out depending on what
    data manager is chosen.
cc_bypass_sm.vhd
    This is the cycle controller bypass mode state machine.
    Certain parts of this drop out depending on what data
    manager is chosen. PLEASE NOTE THAT THE MICROFICHE APPENDIX
    HAS PAGE #5 OF THIS FILE ERRONEOUSLY OUT OF ORDER, AND
    INSTEAD LOCATED AT FRAME #57 of MICROFICHE #1 (instead of
    immediately following page #4 of this file, located at frame
    #49 of microfiche #1).
cc_fe_sm.vhd
    This is the cycle controller front end state machine.
    Certain parts of this drop out depending on what data
    manager is chosen.
class_code_reg.vhd
    PCI-specific register for class_code.
clktree.vhd
    Clock tree synthesis module reference.
command_reg.vhd
    PCI-specific register for command.
config.vhd
    This is a PCI-specific configuration block for a back end
    interface. There is one for each device. It contains
    information for allowing the bus to determine if the
    associated device is the target for the current bus
    transaction. It includes information concerning address
    ranges for the device and its data manager, the various ID
    registers, transfer burst lengths, latency timer values, and
    so on.
configurable_bit_reg.vhd
    This is a general purpose register with a configurable
    width. It is also configurable whether it is filled with 0
    bits or 1 bits when it is reset.
configurable_dword_reg TABLE 2-continued Description of Macro Modules This is a general purpose register with a configurable double word width.

configured_pci_macro.vhd
    This generates sub-blocks of the subparts of the PCI macro.

control_reg.vhd
    PCI-specific register.

cycle_controller.vhd
    This is the cycle controller block. It controls transfers from the buffer block to the back end interface.

cycler.vhd
    This is the byte steering cycler state machine. It controls steering of data from a one bus to another bus or interface having a different size.

data_manager.vhd
    This is the data manager block. It is responsible for transfers from the buffer block to the front end bus.

device_id_reg.vhd
    PCI-specific 16-bit read only register contains the ID for this device.

devsel_timer.vhd
    PCI-specific counter.

dff_iobuf_iopd16.vhd
    Cell library file for flip flop I/O buffer cells; used for simulation and synthesis.

dffpq.vhd
    Cell library file for flip flop cells; used for simulation and synthesis.

dffrpq.vhd
    Cell library file for flip flop cells; used for simulation and synthesis.

dm_bk_sm.vhd
    This is the data manager back end state machine. A different state machine may be built depending on what sort of data manager is chosen.

dm_fe_sm.vhd
    This is the data manager front end state machine. A different state machine may be built depending on what sort of data manager is chosen.

dpr_gen.vhd
    This is a dual port RAM. It generates a RAM of a given size which may be accessed by two things at a time.

fifo.vhd
    This is the entire FIFO block including all the control logic for single or multiple FIFO buffer arrangements.

hbuf.vhd
    Cell library file for buffer cells; used for simulation and synthesis.

header_reg.vhd
    A PCI-specific device header register.

high_bit_reg.vhd
    This creates an 8-bit register in which the bits from 7 down to some bit are defined, and the remaining bits are 0.

inbuf.vhd
    Cell library file for input buffer cells; used for simulation and synthesis.

inpd.vhd
    Cell library file for input pad cells; used for simulation and synthesis.

interrupt_line_reg.vhd
    A PCI-specific interrupt line register.

interrupt_pin_reg.vhd
    A PCI-specific interrupt pin register.

inv.vhd
    Cell library file for inverter cells; used for simulation and synthesis.

iobuf.vhd
    Cell library file for I/O buffer cells; used for simulation and synthesis.

iobuf_iopd12sl.vhd
    Cell library file for buffer I/O pad cells; used for simulation and synthesis.

iobuf_iopd16.vhd
    Cell library file for buffer I/O pad cells; used for simulation and synthesis.

iobufpci.vhd
    Cell library file for PCI I/O buffer cells; used for simulation and synthesis.

TABLE 2-continued

Description of Macro Modules iopd12sl.vhd
    Cell library file for I/O pad cells; used for simulation and
    synthesis.

iopd16.vhd
    Cell library file for I/O pad cells; used for simulation and
    synthesis.

iopdpci.vhd
    Cell library file for PCI I/O pad cells; used for simulation
    and synthesis.

macro_pkg.vhd
    This contains arrays of possible parameter arrays and
    functions, and constant names corresponding to them. It
    contains a number of default values for the various
    parameters. It also contains a number of logical,
    arithmetic, increment, and conversion functions that are
    used all throughout the rest of the modules.

master_latency_timer.vhd
    This PCI-specific counter starts at 0 when it is reset or
    enabled after having been disabled. It counts up until it
    reaches a MSTR_LAT_TIME (Master Latency Time) which is an 8-
    bit value provided by the user of this timer. When that
    number is reached, the TIME_OUT signal is active and
    counting ceases.

master_state_machine.vhd
    This is the front end master part of the finite state
    machine, which speaks to the bus.

max_lat_reg.vhd
    PCI-specific register for max_lat.

memory_element.vhd
    This creates a chunk of memory, either building it from
    flip-flops if it is small enough, or out of dual port RAMs
    if not.

min_gnt_reg.vhd
    PCI-specific register for min_gnt.

miscelaneous_configuration_regs.vhd
    This allows the generation of extra PCI-specifi
    configuration registers for use by devices. If none are
    specified, none are created.

nan2.vhd
    Cell library file for NAND gate cells; used for simulation
    and synthesis.

new_fifo.vhd
    FIFO interface.

new_transfer_counter.vhd
    Counter used in data manager for underlying data transfers.

next_addr_cmpr.vhd
    This contains structures to compare the next address from
    the input bus with a predicted next address. It also
    contains the current address of the next bus transfer for
    the back end device.

opd16.vhd
    Cell library file for OPD16 cells; used for simulation and
    synthesis.

or2.vhd
    Cell library file for OR gate cells; used for simulation and
    synthesis.

otpd16.vhd
    Cell library file for OTPD16 cells; used for simulation and
    synthesis.

output_latch.vhd
    Output latch that accepts data from FIFO dual-port RAM
    output.

parity36.vhd
    This accepts a 32-bit data input and a 4-bit command input,
    and generates a single parity bit from them. This bit is 1
    if the total number of 1 bits in the data and command inputs
    is odd, 0 if it is even.

pci_fsm.vhd
    This is the PCI bus finite state machine module which
    encapsulates the master, slave, parity and address_counter
    to form the interface to the PCI bus.

pci_macro.vhd
    The internal signals are described here. This primary
    module calls all the other subparts (FIFO, cycle controller,
    data manager, back end interface, byte steering, finite
    state machine).

pcimacro_user_params.vhd

TABLE 2-continued

Description of Macro Modules

This contains definitions of the user selectable parameters for the various subparts according to which back end interface type is chosen.
pipeline_block.vhd
   Part of FIFO, and contains dual-port RAM pipeline registers.
revision_id_reg.vhd
   This PCI-specific 8-bit read only register contains some identifier for this revision.
rom_base_address_reg.vhd
   A PCI-specific 32-bit register for ROM base address.
sbuf.vhd
   Cell library file for buffer cells; used for simulation and synthesis.
scan_pci_macro.vhd
   Same as configured_pci_macro.vhd file, but configured for scan testing. This file would be used in lieu of scan_pci_macro if scan testing circuitry is desired to be included.
signaltree.vhd
   Cell library file for signal tree cells; used for simulation and synthesis.
slave_state_machine.vhd
   This is the slave part of the finite state machine, which speaks to the bus.
status_reg.vhd
   This 16-bit register reflects aborted bus cycles issued by devices or received from back end slave devices. It also reflects master aborted bus cycles for back end master devices. Reading this register gives the values of the bits. When writing, any bit in this register that has a 1 written to it is reset to 0.
target_latency_timer.vhd
   This PCI-specific counter is reset to 8 when it is reset or enabled after having been disabled. When it reaches 0, the TIME_OUT signal becomes active.
valid_data_counter.vhd
   This is part of the FIFO block. Its function is related to determining where the next empty cell in the buffer is.
vendor_id_reg.vhd
   This PCI-specific 16-bit, read only, register contains an ID for the particular vendor for this part (e.g. device adapter chip or card).

In summary, we have described a method and apparatus for producing an electronic circuit which allows a device to be connected to a bus, such as a system bus in a computer. The invention accepts user specified parameters for configuring a device adapter which interfaces the device to the bus, and thereafter generates a customized device adapter based on such user specified parameters. By using a common design macro, which is programmable, a user can easily specify and generate custom device adapters for a plurality of dissimilar devices to be connected to the bus. A resulting adapter architecture allows for multiple, dissimilar devices to interface to a computer bus with a single device adapter integrated circuit or card.

Numerous substitutions and modifications can be undertaken without departing from the true spirit and scope of the invention. What is desired to be secured by Letters Patent is the Invention as defined in the following claims.

We claim:

1. An automated system for producing a logical representation of an adapter for connecting a bus with a device, comprising:
   a macro that is configurable to provide a plurality of dissimilar logical representations of said adapter;
   means for specifying physical characteristics of said adapter; and
   means for producing a database indicative of said logical representation of said adapter based on said macro and said physical characteristics.

2. A system according to claim 1 in which said characteristics include:
   width of a device interface; and
   a buffer size.

3. A system according to claim 1 in which said logical representation is of a gate-level type, taking the form of a net list.

4. A production system for an adapter which facilitates communication between a computer bus and a device, comprising:
   a macro that is configurable to provide a plurality of dissimilar logical representations of said adapter;
   means for receiving data indicating physical characteristics of said adapter; and
   means for synthesizing a representation of said adapter based on said received data and said macro.

5. The production system of claim 4 wherein said received data indicates any of width of a device interface and buffer size.

6. An automated system for producing a logical representation of an adapter that connects a bus with a device, comprising:
   a macro that is configurable to provide a plurality of dissimilar logical representations of the adapter;
   physical characteristics coupled to the macro that influence the logical representation of the adapter; and a database indicative of the logical representation of the adapter and based, at least in part, on the macro and the physical characteristics.

7. The automated system for producing the logical representation of the adapter that connects the bus with the device as recited in claim 6, wherein the physical characteristics comprise at least three of: buffer size, device data path width, bus data path width, interface type, address size, and buffer packing.

8. The automated system for producing the logical representation of the adapter that connects the bus with the device as recited in claim 6, wherein a contractual interface is specified for the adapter.

9. The automated system for producing the logical representation of the adapter that connects the bus with the device as recited in claim 6, wherein the database is synthesized with the macro and the physical characteristics.

10. The automated system for producing the logical representation of the adapter that connects the bus with the device as recited in claim 6, wherein the database comprises a gate-level netlist.

11. The automated system for producing the logical representation of the adapter that connects the bus with the device as recited in claim 6, wherein routing of the adapter is performed using the database.

12. The automated system for producing the logical representation of the adapter that connects the bus with the device as recited in claim 6, wherein integrated circuit masks are created which are related to the database.

13. The automated system for producing the logical representation of the adapter that connects the bus with the device as recited in claim 6, wherein the adapter is fabricated with at least one integrated circuit.

14. The automated system for producing the logical representation of the adapter that connects the bus with the device as recited in claim 6, wherein the adapter comprises at least one of:

a buffer for storing data;

cycle control logic;

user logic; and a finite state machine.

15. The automated system for producing the logical representation of the adapter that connects the bus with the device as recited in claim 6, wherein the macro comprises hardware description language commands.

16. The automated system for producing the logical representation of the adapter that connects the bus with the device as recited in claim 6, wherein the macro comprises VHDL commands.

17. The automated system for producing the logical representation of the adapter that connects the bus with the device as recited in claim 6, wherein the macro comprises at least one of:

a finite state manager function;

a data manager function;

a buffer function; and a cycle controller function.

18. A method for creating a logical representation of an adapter that facilitates communication between a computer bus and a device, the method comprising steps of:

providing a macro that is configurable to provide a plurality of dissimilar logical representations of the adapter;

receiving physical characteristics of the adapter; and synthesizing the logical representation of the adapter using the physical characteristics and the macro.

19. The method for creating the logical representation of the adapter that facilitates communication between the computer bus and the device as recited in claim 18, further comprising a step of defining user logic to couple the device with a back-end interface.

20. The method for creating the logical representation of the adapter that facilitates communication between the computer bus and the device as recited in claim 18, wherein the physical characteristics comprise at least three of: buffer size, device data path width, bus data path width, interface type, address size, and buffer packing.

21. The method for creating the logical representation of the adapter that facilitates communication between the computer bus and the device as recited in claim 18, further comprising a step of specifying a contractual interface with the adapter.

22. The method for creating the logical representation of the adapter that facilitates communication between the computer bus and the device as recited in claim 18, wherein the logical representation comprises a gate-level netlist.

23. The method for creating the logical representation of the adapter that facilitates communication between the computer bus and the device as recited in claim 18, further comprising a step of routing the adapter using the logical representation.

24. The method for creating the logical representation of the adapter that facilitates communication between the computer bus and the device as recited in claim 18, wherein the adapter comprises at least one of:

a buffer for storing data;

cycle control logic;

user logic; and a finite state machine.

25. The method for creating the logical representation of the adapter that facilitates communication between the computer bus and the device as recited in claim 18, wherein the macro comprises at least one of:

a finite state manager function;

a data manager function;

a buffer function; and a cycle controller function.

* * * * *